United States Patent [19]

Palara et al.

[11] Patent Number: 5,790,039
[45] Date of Patent: Aug. 4, 1998

[54] METHOD FOR DETECTING THE PRESENCE OF A SPARK IN AN ELECTRONIC IGNITION SYSTEM USED WITH AN INTERNAL COMBUSTION ENGINE

[75] Inventors: Sergio Palara, Acitrezza, Italy; Benedetto P. DiCicco, Sterling Heights, Mich.

[73] Assignees: SGS-Thomson Microelectronics S.r.l., Agrate Briana, Italy; Chrysler Corporation, Auburn Hills, Mich.

[21] Appl. No.: 639,779

[22] Filed: Apr. 29, 1996

[30] Foreign Application Priority Data

Apr. 28, 1995 [EP] European Pat. Off. ............ 95830169

[51] Int. Cl.$^6$ .................. G08B 21/00; F02P 17/00; F02M 51/00
[52] U.S. Cl. .................. 340/662; 340/659; 324/380; 324/388; 123/479; 123/630
[58] Field of Search .................. 340/662, 659, 340/438; 324/388, 378, 393, 399, 402; 123/643, 644, 479, 630

[56] References Cited

U.S. PATENT DOCUMENTS

| 4,377,785 | 3/1983 | Ueno et al. | 324/388 |
| 4,918,389 | 4/1990 | Schleupen et al. | 324/388 |
| 5,019,779 | 5/1991 | Ookawa | 324/388 |
| 5,075,627 | 12/1991 | Bodig et al. | 324/384 |
| 5,283,527 | 2/1994 | DeBiasi | 324/388 |
| 5,446,385 | 8/1995 | Kugler et al. | 324/388 |
| 5,495,757 | 3/1996 | Atanasyan et al. | 324/380 |
| 5,534,781 | 7/1996 | Lee et al. | 324/388 |

FOREIGN PATENT DOCUMENTS

| A0 023 708 | 2/1981 | European Pat. Off. . |
| A0 390 314 | 3/1990 | European Pat. Off. . |
| A0 386 431 | 9/1996 | European Pat. Off. . |
| A4 020 986 | 1/1992 | Germany . |

*Primary Examiner*—Brent A. Swarthout
*Assistant Examiner*—Van T. Trieu
*Attorney, Agent, or Firm*—Wolf, Greenfield & Sacks, P.C.; James H. Morris

[57] ABSTRACT

A method for detecting the presence of a spark in an electronic ignition system. The method consists of generating an overvoltage event and then generating a voltage signal proportional to the overvoltage event. The onset of the overvoltage event is detected by comparing the voltage signal to a starting threshold voltage and in response is provided a first signal at a high logic level. The first signal is maintained at said high logic level during the time duration of the overvoltage event. The termination of the overvoltage event is detected by comparing the voltage signal to an ending threshold voltage, which is lower than the starting threshold voltage and proportional to a supply voltage of the electronic ignition system, and in response is provided a second signal at a low logic level. The time duration of the first signal is detected and then the presence of a spark is signalled if said time duration exceeds a reference value.

31 Claims, 5 Drawing Sheets

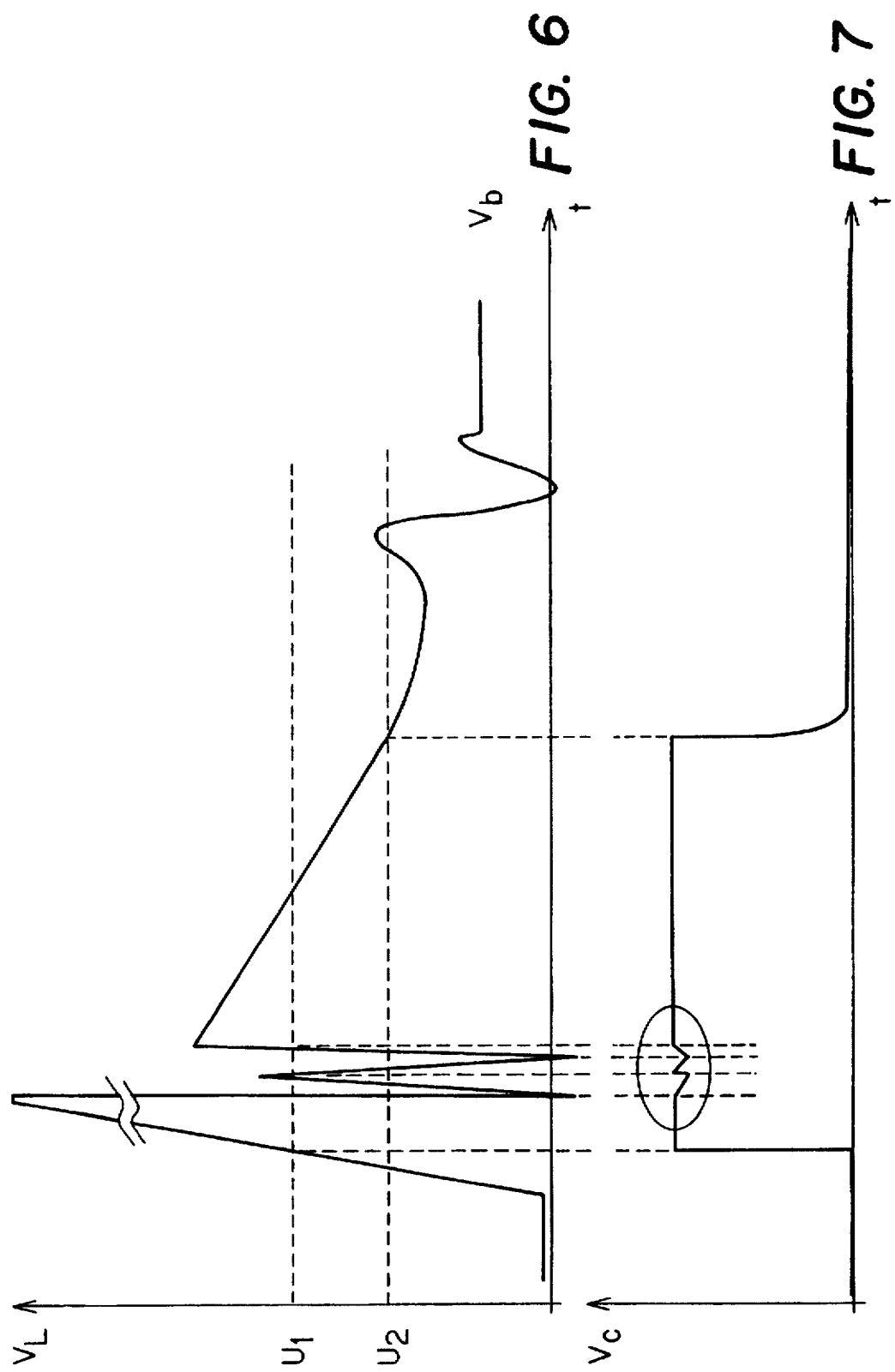

METHOD FOR DETECTING THE PRESENCE OF A SPARK IN AN ELECTRONIC IGNITION SYSTEM USED WITH AN INTERNAL COMBUSTION ENGINE

CROSS REFERENCE TO RELATED APPLICATION

This application is related to U.S. patent application Ser. No. 08/639,794, entitled "Circuit for Detecting an Overvoltage on a Switched Inductive Load" filed on the same date as this application. This related application is hereby incorporated by reference herein.

BACKGROUND OF THE INVENTION

1. Field of the Invention

The present invention relates to a method for detecting the presence of a spark in an electronic ignition system used with an internal combustion engine.

2. Description of the Related Art

In conventional electronic ignition systems used with internal combustion engines and including an ignition coil with primary and secondary winding it is necessary to detect whether, during the power stage, a spark is present or absent on the secondary winding of the ignition coil. If there is no spark, it is necessary to take remedial action in order to avoid deterioration of the catalytic converter.

A known technical solution for meeting this necessity is described in European Patent Application 88108869.4 which discloses detecting the presence or absence of a spark on the secondary winding of the ignition coil by sensing changes in the voltage on the primary winding.

To clarify this phenomenon, reference is made to FIG. 1. When a control switch S included in the electronic ignition system closes, a current passes in the primary winding L' of the ignition coil L whose behavior is linearly increasing in time. Upon opening control switch S, the voltage VL present on the primary winding L' of the ignition coil L increases rapidly. After a certain period of time, it reaches the value of the supply voltage Vb provided by the vehicle's battery. If no spark is produced by the secondary winding L" of the ignition coil L, the time duration of the overvoltage event is approximately 100 μs. But in the presence of a spark the time duration of the overvoltage event is approximately 2 ms.

SUMMARY OF THE INVENTION

A principal object of the present invention is the provision of a method for correct and accurate determination of the presence of a spark in an electronic ignition system used with an internal combustion engine.

The preferred embodiment of the invention is implemented in a method for detecting the presence of a spark in an electronic ignition system used with an internal combustion engine. The electronic ignition system includes an ignition coil that has primary and secondary windings connected to a supply voltage generator. The method consists of generating an overvoltage event on the primary winding of the ignition coil and then generating a voltage signal proportional to the overvoltage event. The onset of the overvoltage event is detected by comparing the voltage signal to a starting threshold voltage. When an overvoltage is detected, a first signal, preferably of a digital type, is provided. In a preferred embodiment of the invention, a first digital signal is at a high logic level. The first digital signal is maintained at the high logic level during the time duration of the overvoltage event. The termination of the overvoltage event is detected by comparing the voltage signal to an ending threshold voltage. This ending threshold voltage is lower than the starting threshold voltage and proportional to the supply voltage, and in response provides a second signal, preferably of a digital type. In a preferred embodiment of the invention, the second digital signal is at a low logic level. The time duration of the first digital signal is detected and then the presence of a spark is verified if the time duration exceeds a reference value.

The features and advantages of the method according to the present invention will become apparent from the following description of an embodiment thereof, given by way of example and not limitation, with reference to the accompanying drawings.

BRIEF DESCRIPTION OF THE DRAWINGS

FIGS. 3, 4, 5, 6 and 7 are graphs of the voltages present in the circuit of FIG. 2.

DETAILED DESCRIPTION OF THE PREFERRED EMBODIMENT

With reference to the FIGS. reference number 1 indicates as a whole and diagrammatically a detection circuit which implements a method, in accordance with the present invention, for detecting the presence of a spark produced by an ignition coil L included in an electronic ignition system used with an internal combustion engine.

Figure 1:
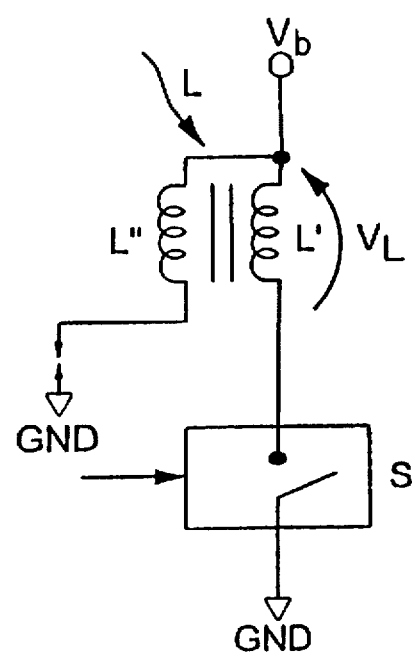
FIG. 1 is a simplified diagram of an electronic ignition system used with an internal combustion engine.
Figure 2:
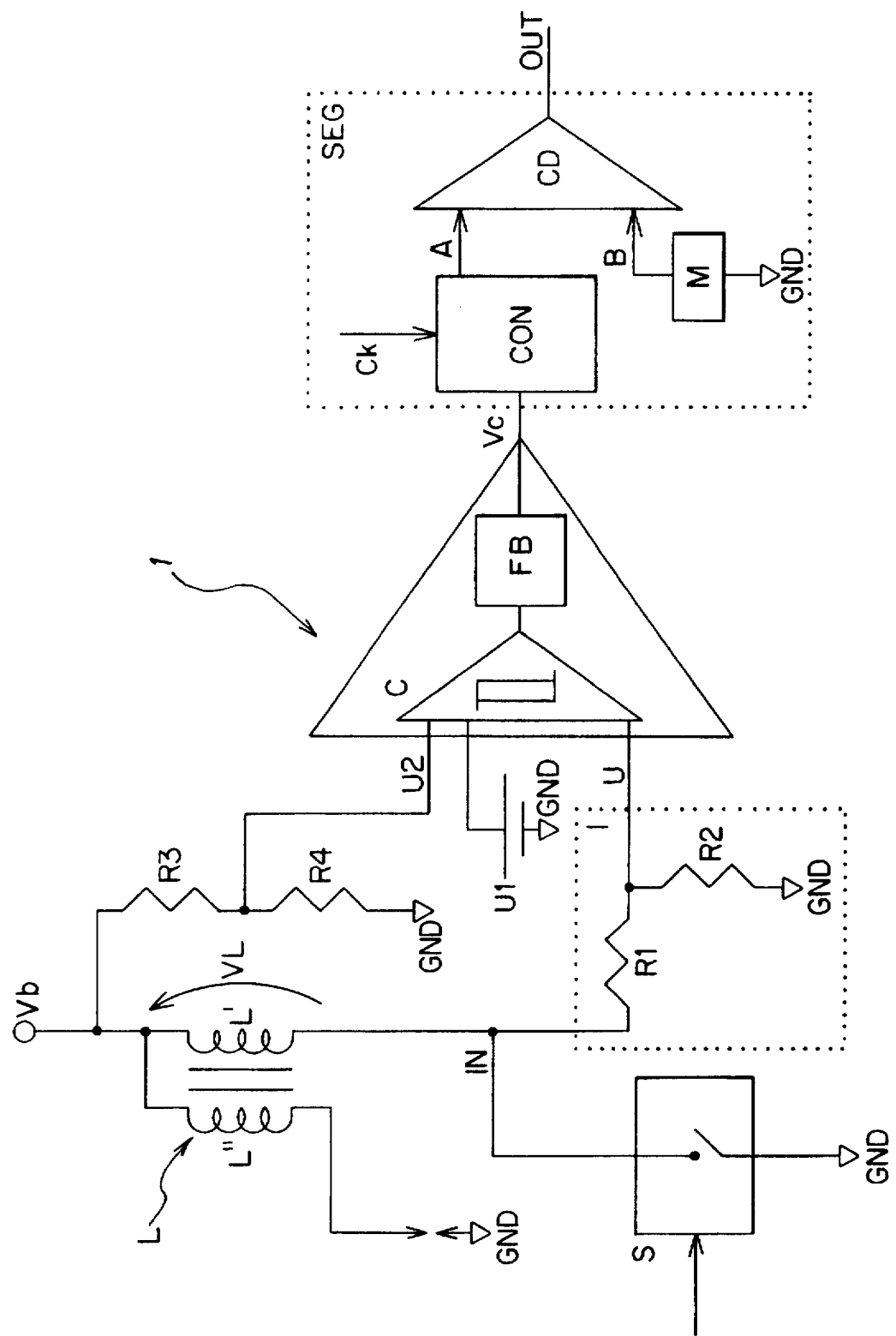
FIG. 2 is a block diagram of a detection circuit which implements a method for detecting the presence of a spark in an electronic ignition system in accordance with the present invention.

With reference to FIG. 2 the coil L comprises a primary winding L' connected between a power supply voltage generator Vb and an input terminal IN of the detection circuit 1. The coil also includes a secondary winding L" connected between the power supply voltage generator Vb and a ground terminal GND. Circuit 1 has an output terminal OUT for signalling the presence of a spark on the secondary winding L" of the coil L.

Circuit 1 also includes a control switch S connected between the input terminal IN and the ground terminal GND. The circuit 1 further includes an input block I, provided e.g. by resistive divider (R1,R2), having an input terminal corresponding to the input terminal IN of the circuit 1 and an output terminal for producing a voltage signal designated U.

Circuit 1 also includes a comparator C with hysteresis having a first input terminal connected to the output terminal U of the input block I, a second input terminal kept at a first reference voltage U1, a third input terminal kept at a second reference voltage U2, and an output terminal for producing through a low-pass filter FB, a voltage signal designated Vc. The first U1 and the second U2 reference voltages represent a starting and an ending threshold voltages of the comparator C. In a preferred embodiment of the circuit 1, the starting threshold voltage is the upper threshold voltage of the comparator C and the ending threshold voltage is the lower threshold voltage of the comparator C. The ending threshold voltage U2 is obtained preferably by a resistive divider (R3,R4) connected between the supply voltage generator Vb and the ground terminal GND.

Circuit 1 also includes a signalling block SEG having an input terminal connected to the output terminal Vc of the the comparator C and an output terminal corresponding to the output terminal OUT of the circuit 1. The signalling block SEG comprises a counter CON having a first input terminal corresponding to the output terminal of the comparator C, a second input terminal for receiving a timing signal Ck and an output terminal for producing a value designated A, preferably of a binary type. The signalling block SEG also includes a digital comparator CD having a first input terminal connected to the output terminal A of the counter CON, a second input terminal B connected to a memory element M, and an output terminal corresponding to the output terminal OUT of the signalling block SEG, wherein in the memory element M is stored a reference value, preferably of a binary type.

Now described is the operation of circuit 1 with particular reference to an initial state in which the control switch S is opened after having been closed for some duration of time. In this state, across the ends of the primary winding L' of the ignition coil L is present an overvoltage event VL.

Figures 3, 4:
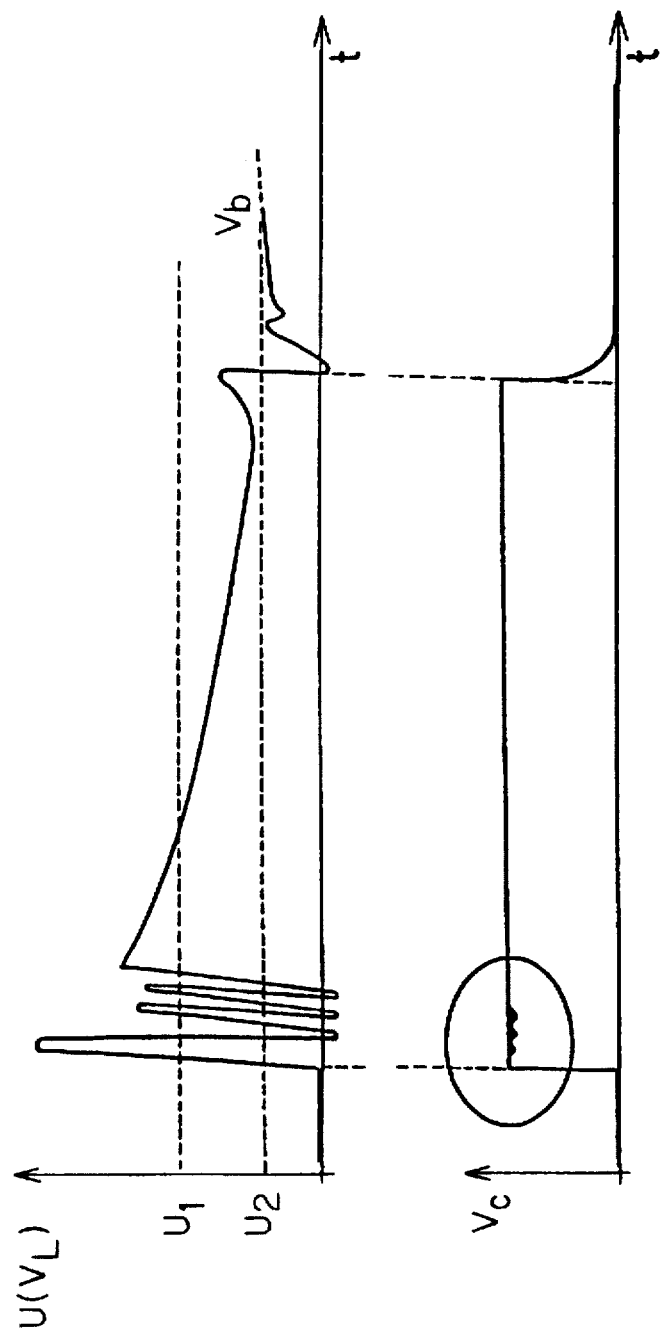

Circuit 1 receives on the input terminal IN the overvoltage event VL and produces, by the resistive divider (R1,R2), the voltage signal U, shown in FIG. 3, proportional to the overvoltage event VL. The comparator C with hysteresis compares the voltage U with the starting U1 and the ending U2 threshold voltages and produces at the output terminal Vc, the voltage signal Vc which is at a first logic level, which in a preferred embodiment of the invention is high, when the voltage U exceeds the starting threshold voltage U1. By the filter FB, the voltage Vc keeps the first logic level for the entire time duration of the overvoltage event VL until the voltage U falls below the starting threshold voltage U2, as shown in FIG. 4.

Figure 5:
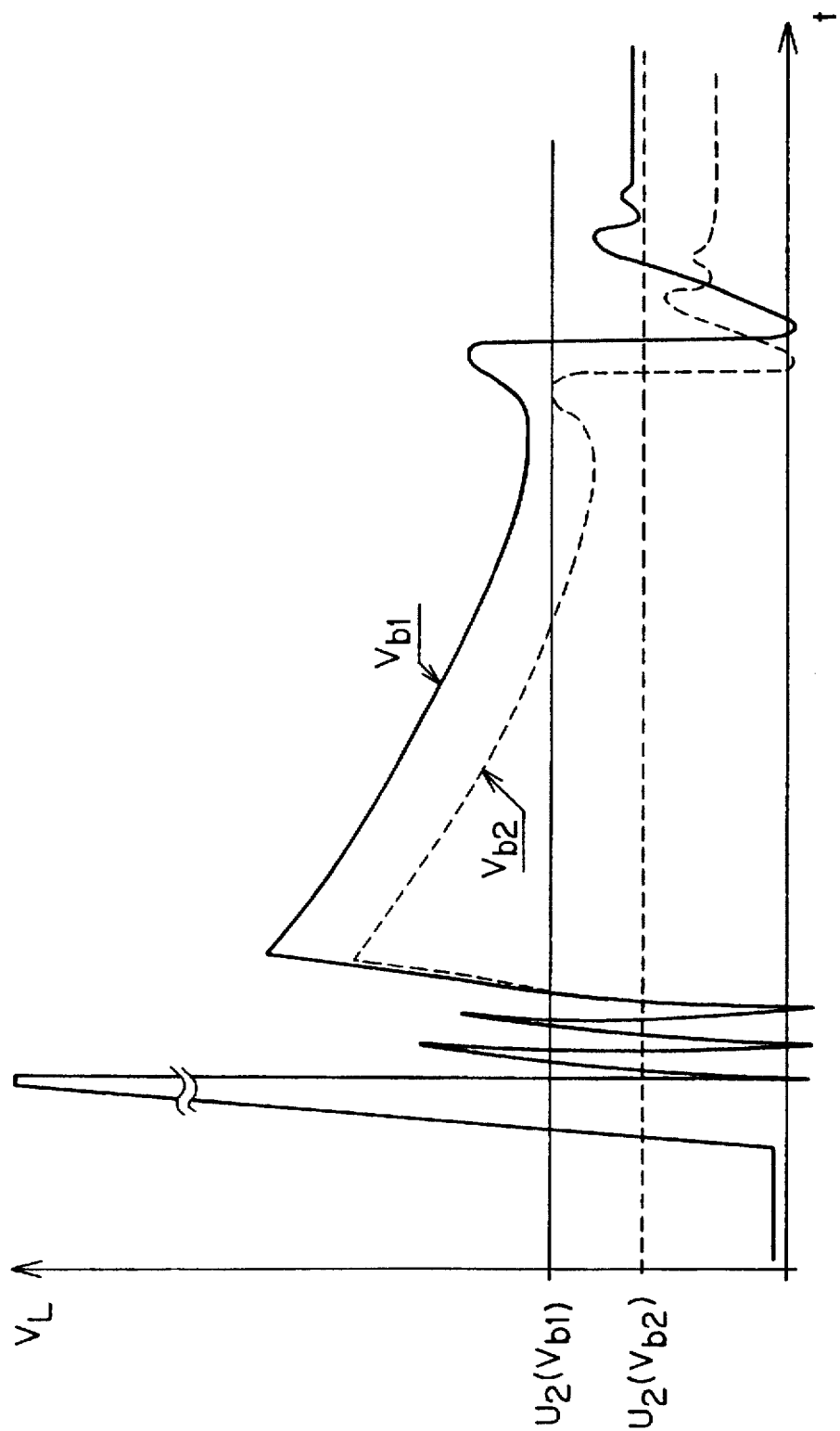

The height of the curve representing the behavior of the overvoltage event VL if there is a spark on the secondary winding L" of the coil L depends, as can be seen in FIG. 5, on the supply voltage Vb. Specifically, with the supply voltage at a value Vb1, the overvoltage event VL will be as shown by the solid line indicated as Vb1. When the supply voltage is at a value Vb2, lower than the value Vb1, the overvoltage event VL will be as shown by the dashed line indicated as Vb2. Similarly, since the ending threshold voltage U2 is a function of the supply voltage Vb, when the supply voltage is at Vb1 the ending threshold voltage U2 (Vb1) will be as shown by the horizontal solid line and the ending threshold voltage U2 (Vb2) will be as shown by the dashed horizontal line. If the ending threshold voltage U2 is not made proportional to the supply voltage Vb, but is kept constant, the comparator C can will detect the end of the overvoltage event only due to a change of the supply voltage Vb and not due to the termination of the overvoltage event, as shown in FIGS.6 and 7.

The counter CON produces at the output terminal A, a binary value proportional to the time duration of the voltage Vc. This value is compared with the reference binary value by the digital comparator CD. If the binary value is greater than the reference value the digital comparator CD switches to a logic level, which in a preferred embodiment of the invention is high, and signals on the output terminal OUT of the circuit 1 the presence of the spark.

What is claimed is:

1. A method for detecting a presence of a spark in an electronic ignition system, the method comprising the steps of:
   generating an overvoltage event;
   generating a voltage signal representative of said overvoltage event;
   detecting said overvoltage event;
   generating a first signal responsive to said overvoltage event;
   detecting termination of said overvoltage event, dependent on said voltage signal and an ending threshold voltage proportional to a supply voltage of said electronic ignition system;
   detecting a time duration of said first signal; and
   signalling the presence of the spark responsive to said time duration of said first signal exceeding a reference value.

2. The method of claim 1, wherein the step of detecting said overvoltage event includes the steps of:
   comparing the voltage signal with a starting threshold voltage different from said ending threshold voltage; and
   generating said first signal responsive to said voltage signal exceeding said starting threshold voltage.

3. The method of claim 2, wherein said starting threshold voltage comprises a constant voltage.

4. The method of 2, wherein said ending threshold voltage is lower than the starting threshold voltage.

5. The method of claim 1, wherein the step of detecting the termination of the overvoltage event includes the step of:
   comparing said voltage signal with said ending threshold voltage.

6. The method of claim 1, wherein the step of detecting the time duration of the first signal comprises the step of:
   generating a value representative of the time duration of the first signal.

7. The method of claim 6, wherein the step of signalling the presence of a spark includes the steps of:
   comparing the value with the reference value; and
   producing an output at a first logic level when said value exceeds said reference value.

8. A method for detecting the presence of a spark in an electronic ignition system, the electronic ignition system including an ignition coil having primary and secondary windings coupled to a supply voltage generator, the method comprising the steps of:
   generating an overvoltage event on the primary winding of the ignition coil;
   generating an overvoltage signal proportional to said overvoltage event;
   detecting said overvoltage event;
   generating a first signal responsive to an onset of said overvoltage event, wherein said first signal is at a first logic level;
   detecting termination of said overvoltage event when said overvoltage signal falls below an ending threshold voltage proportional to a supply voltage of said supply voltage generator;
   generating the first signal, responsive to said termination, at a second logic level;
   detecting a time duration of said first signal; and
   signalling the presence of the spark responsive to said time duration of said first signal exceeding a reference value.

9. The method of claim 8, wherein the step of detecting said overvoltage event includes the steps of:
   comparing the overvoltage signal with a starting threshold voltage different from said ending threshold voltage; and
   generating said first signal responsive to said overvoltage signal exceeding said starting threshold voltage.

10. The method of claim 9, wherein said starting threshold voltage is a constant voltage.

11. The method of 9, wherein said ending threshold voltage is lower than starting threshold voltage.

12. The method of claim 8, wherein the step of detecting the termination of the overvoltage event includes the step of:

comparing said overvoltage signal with said ending threshold voltage.

13. The method of claim 8, wherein the step of detecting the time duration of the first signal comprises the step of:

generating a value proportional to a time duration of the first signal.

14. The method of claim 13, wherein the step of signalling the presence of a spark includes the steps of:

comparing the value with the reference value; and producing an output at the first logic level when said value exceeds said reference value.

15. A method for detecting a presence of a spark in an electronic ignition system used with an internal combustion engine, the electronic ignition system including an ignition coil having primary and secondary windings coupled to a supply voltage generator, the method comprising the steps of:

generating an overvoltage event on the primary winding of the ignition coil;

generating an overvoltage signal proportional to the overvoltage event;

detecting an onset of the overvoltage event and in response producing a first voltage signal at a high logic level when the overvoltage signal exceeds a starting threshold voltage;

maintaining the first voltage signal at the high logic level during a time duration of the overvoltage event;

detecting the termination of the overvoltage event and in response producing the first voltage signal at a low logic level when the overvoltage signal falls below an ending threshold voltage different from said starting threshold voltage, wherein the ending threshold voltage is proportional to a supply voltage generated by the supply voltage generator;

detecting a time duration of the first voltage signal; and signalling the presence of the spark when the time duration of the first voltage signal exceeds a reference value.

16. The method of claim 15, wherein the step of detecting the onset of the overvoltage event includes the steps of:

comparing the overvoltage signal with the starting threshold voltage; and generating the first voltage signal at the high logic level when the overvoltage signal exceeds the starting threshold voltage.

17. The method of claim 15, wherein the step of detecting the termination of the overvoltage event includes the step of:

comparing the overvoltage signal with the ending threshold voltage, wherein the ending threshold voltage is lower than the first threshold voltage.

18. The method of claim 15, wherein the step of detecting the time duration of the first voltage signal comprises the step of:

generating a value proportional to the time duration of the first voltage signal.

19. The method of claim 18, wherein the step of signalling the presence of a spark includes the steps of:

comparing said value with the reference value; and producing an output at the high logic level when said value exceeds the reference value.

20. The method of claim 15, wherein the starting threshold voltage is a constant voltage.

21. The method of claim 1, wherein the step of detecting the time duration of the first signal comprises the step of:

measuring an amount of time during which the first signal was at a first logic level prior to being at a second logic level.

22. The method of claim 8, wherein the step of detecting the time duration of the first signal comprises the step of:

measuring an amount of time during which the first signal was at the first logic level prior to being at the second logic level.

23. The method of claim 15, wherein the step of detecting the time duration of the first voltage signal comprises the step of:

measuring an amount of time during which the first voltage signal was at the first logic level prior to being at the second logic level.

24. A spark detecting circuit for detecting a spark in an electronic ignition system of an internal combustion engine, the electronic ignition system including an ignition coil having a primary winding and a secondary winding, each winding coupled to a supply voltage generator at a respective first winding end, the spark detecting circuit comprising:

a comparator having a first input, a second input and a third input, the first input coupled to a second winding end of the primary winding to receive a primary winding voltage signal, the second input to receive a starting reference voltage and the third input to receive an ending reference voltage different from the starting reference voltage, the ending reference voltage proportional to a supply voltage of the supply voltage generator, the comparator further comprising an output lead to output and maintain a comparator signal at a first logic level when the primary winding voltage signal is at least the starting reference voltage until the primary winding voltage signal is less than the ending reference voltage in response to which the comparator signal is set to a second logic level different from the first logic level; and a first circuit to receive the comparator signal and to measure a time duration of the comparator signal indicating how long the comparator signal was at the first logic level and to compare the measured time duration to a predetermined value;

wherein, when the measured time duration exceeds the predetermined value, an output of the first circuit is set to the first logic level indicating the spark has been detected in the electronic ignition system.

25. The spark detecting circuit as recited in claim 24, further comprising:

a second circuit coupled between the second winding end of the primary winding and the first input of the comparator, the second circuit coupling the primary winding voltage signal to the first input of the comparator;

wherein the primary winding voltage signal is proportional to a winding voltage at the second winding end of the primary winding.

26. The spark detecting circuit as recited in claim 24, further comprising:

a voltage divider circuit having an input coupled to the supply voltage generator and an output to provide the ending reference voltage.

27. The spark detecting circuit as recited in claim 26, wherein the voltage divider circuit comprises first and second resistors in series, coupled to one another at a common node, the common node coupled to the output of the voltage divider circuit.

28. A method for detecting a spark in a secondary winding of an ignition coil in an electronic ignition system, the ignition coil including a primary winding and the secondary winding, each winding coupled to a supply voltage generator, the method comprising the steps of:

detecting a primary coil voltage signal on the primary coil;

when the primary coil voltage signal is at least a starting threshold voltage, producing a first voltage signal at a first logic level;

maintaining the first voltage signal at the first logic level while the primary coil voltage signal is at least the starting threshold voltage;

when the primary coil voltage signal falls below an ending threshold voltage different from the starting threshold voltage, wherein the ending threshold voltage is proportional to a supply voltage generated by the supply voltage generator, producing the first voltage signal at a second logic level different from the first logic level;

measuring a length of time during which the first signal was at the first logic level; and when the measured length of time exceeds a reference value, indicating a presence of the spark in the secondary winding.

29. A method for determining when a time duration of an overvoltage event in an electronic ignition system used with an internal combustion engine exceeds a predetermined time period, the electronic ignition system including an ignition coil having primary and secondary windings coupled to a supply voltage generator, the method comprising the steps of:

generating the overvoltage event on the primary winding of the ignition coil;

generating a primary coil voltage signal proportional to the overvoltage event;

when the primary coil voltage signal has a value which is at least a starting threshold voltage, producing a first voltage signal at a first logic level;

maintaining the first voltage signal at the first logic level while the primary coil voltage signal value is at least the starting threshold voltage;

when the primary coil voltage signal value falls below an ending threshold voltage different from the starting threshold voltage, wherein the ending threshold voltage is proportional to a supply voltage generated by the supply voltage generator, producing the first voltage signal at a second logic level different from the first logic level;

determining a length of time during which the first voltage signal was at the first logic level; and determining that the overvoltage event exceeded the predetermined time period when the determined length of time during which the first voltage signal was at the first logic level exceeds a reference value proportional to the predetermined time period.

30. A method for determining when a time duration of an overvoltage event in an electronic ignition system used with an internal combustion engine exceeds a predetermined time period, the electronic ignition system including an ignition coil having primary and secondary windings coupled to a supply voltage generator, the method comprising the steps of:

detecting a primary coil voltage signal on the primary coil;

when the primary coil voltage signal is at least a starting threshold voltage, producing a first voltage signal at a first logic level;

maintaining the first voltage signal at the first logic level while the primary coil voltage signal is at least the starting threshold voltage;

when the primary coil voltage signal falls below an ending threshold voltage different from the starting threshold voltage, wherein the ending threshold voltage is proportional to a supply voltage generated by the supply voltage generator, producing the first voltage signal at a second logic level different from the first logic level;

measuring a length of time during which the first voltage signal was at the first logic level; and when the measured length of time exceeds a reference value proportional to the predetermined time period, determining that the overvoltage event exceeded the predetermined time period.

31. An apparatus for determining when a time duration of an overvoltage event in an electronic ignition system used with an internal combustion engine exceeds a predetermined time period, the electronic ignition system including an ignition coil having primary and secondary windings coupled to a supply voltage generator, the apparatus comprising:

means for detecting a primary coil voltage signal on the primary coil;

means for producing a first voltage signal at a first logic level when the primary coil voltage signal is at least a starting threshold voltage;

means for maintaining the first voltage signal at the first logic level while the primary coil voltage signal is at least the starting threshold voltage;

means for producing the first voltage signal at a second logic level different from the first logic level when the primary coil voltage signal falls below an ending threshold voltage different from the starting threshold voltage, wherein the ending threshold voltage is proportional to a supply voltage generated by the supply voltage generator;

means for measuring a length of time during which the first voltage signal was at the first logic level; and means for determining that the overvoltage event exceeded the predetermined time period when the measured length of time exceeds a reference value proportional to the predetermined time period.

* * * * *

UNITED STATES PATENT AND TRADEMARK OFFICE
CERTIFICATE OF CORRECTION

PATENT NO. : 5,790,039
DATED : August 4, 1998
INVENTOR(S) : Sergio PALARA and Benedetto P. DI CICCO It is certified that error appears in the above-identified patent and that said Letters Patent is hereby corrected as shown below:

In claim 4, line 1, after "The method of" insert the word --claim--.
In claim 11, line 1, after "The method of" insert the word --claim--.

Signed and Sealed this

Eighth Day of December, 1998

Attest:

Attesting Officer

BRUCE LEHMAN

Commissioner of Patents and Trademarks